(12) United States Patent
Mitros et al.

(10) Patent No.: US 8,946,805 B2
(45) Date of Patent: Feb. 3, 2015

(54) REDUCED AREA SINGLE POLY EEPROM

(75) Inventors: Jozef C. Mitros, Richardson, TX (US); Keith Jarreau, Plano, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 360 days.

(21) Appl. No.: 12/537,086

(22) Filed: Aug. 6, 2009

(65) Prior Publication Data

US 2010/0032744 A1 Feb. 11, 2010

Related U.S. Application Data

(60) Provisional application No. 61/086,922, filed on Aug. 7, 2008.

(51) Int. Cl.
| | |
|---|---|
| H01L 29/788 | (2006.01) |
| H01L 29/06 | (2006.01) |
| H01L 29/423 | (2006.01) |
| H01L 29/66 | (2006.01) |
| H01L 21/28 | (2006.01) |

(52) U.S. Cl.
CPC ........ *H01L 29/7883* (2013.01); *H01L 29/0692* (2013.01); *H01L 29/42324* (2013.01); *H01L 29/66825* (2013.01); *H01L 21/28273* (2013.01)
USPC ........... 257/316; 257/312; 257/314; 257/347; 257/E21.409; 257/E29.3

(58) Field of Classification Search
USPC ....... 257/316, E21.409, E29.3, 312, 314, 347
See application file for complete search history.

(56) References Cited

U.S. PATENT DOCUMENTS

| | | | |
|---|---|---|---|
| 7,869,279 B1 * | 1/2011 | Ratnakumar | 365/185.18 |
| 2009/0122614 A1 * | 5/2009 | Mitros et al. | 365/185.18 |

* cited by examiner

*Primary Examiner* — Lynne Gurley
*Assistant Examiner* — Vernon P Webb
(74) *Attorney, Agent, or Firm* — Rose Alyssa Keagy; Frederick J. Telecky, Jr.

(57) ABSTRACT

A single poly EEPROM cell in which the read transistor is integrated in either the control gate well or the erase gate well. The lateral separation of the control gate well from erase gate well may be reduced to the width of depletion regions encountered during program and erase operations. A method of forming a single poly EEPROM cell where the read transistor is integrated in either the control gate well or the erase gate well.

20 Claims, 14 Drawing Sheets

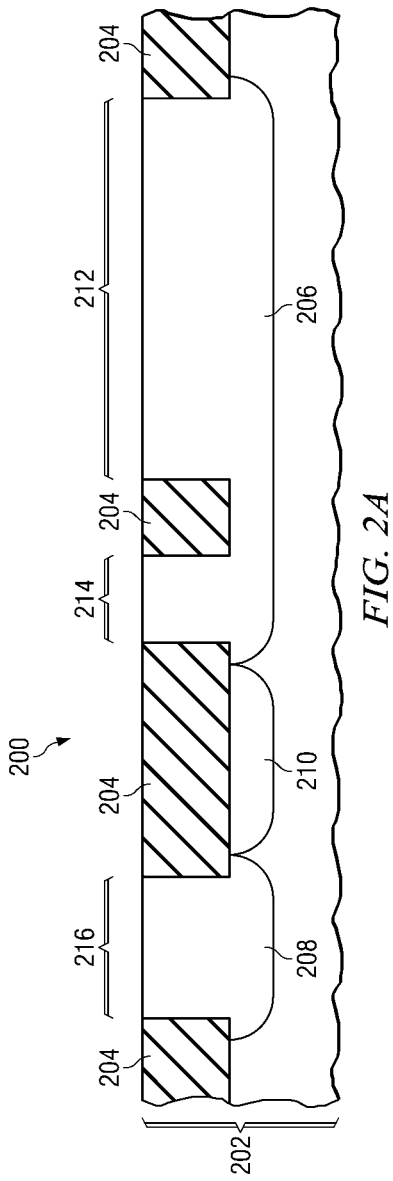
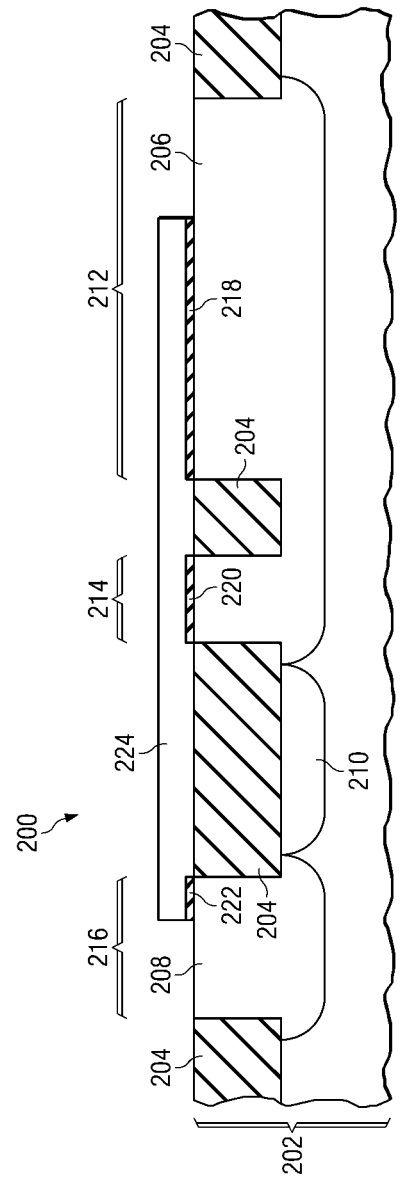

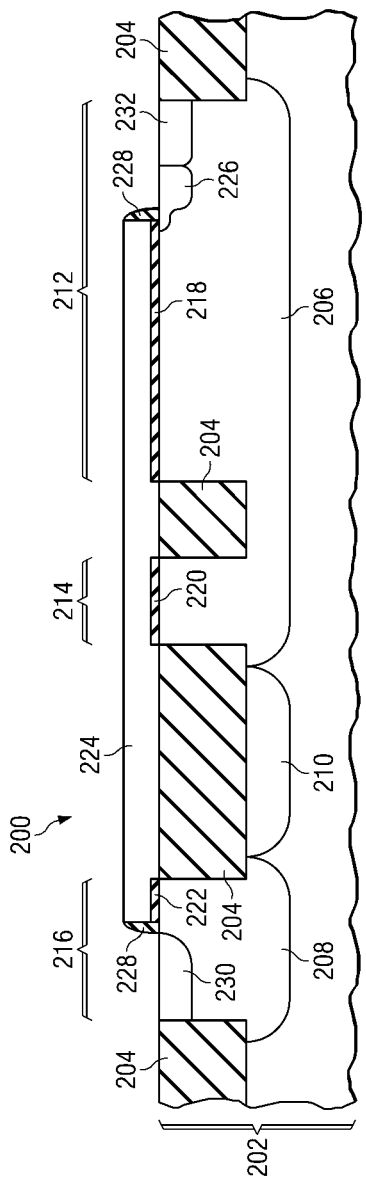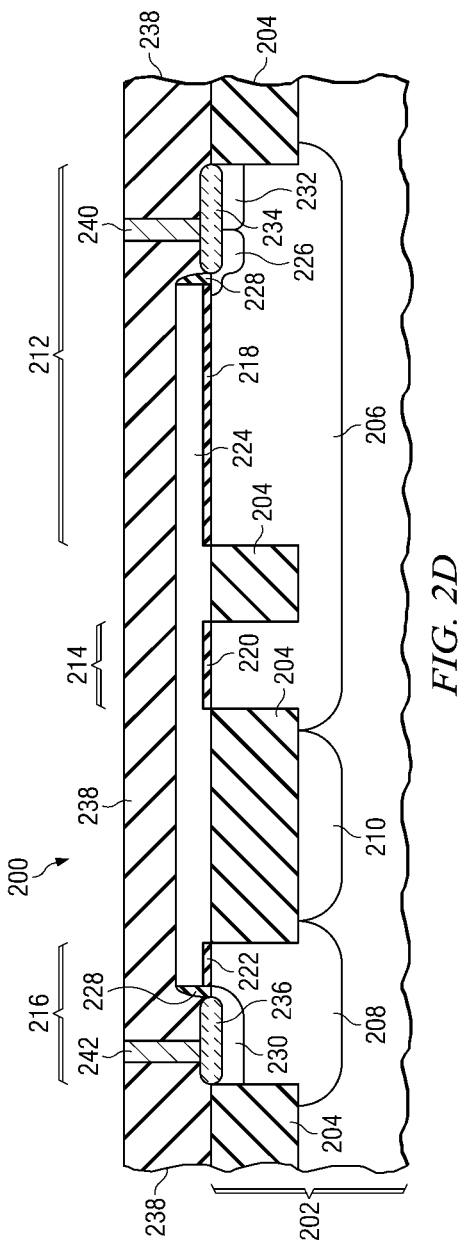

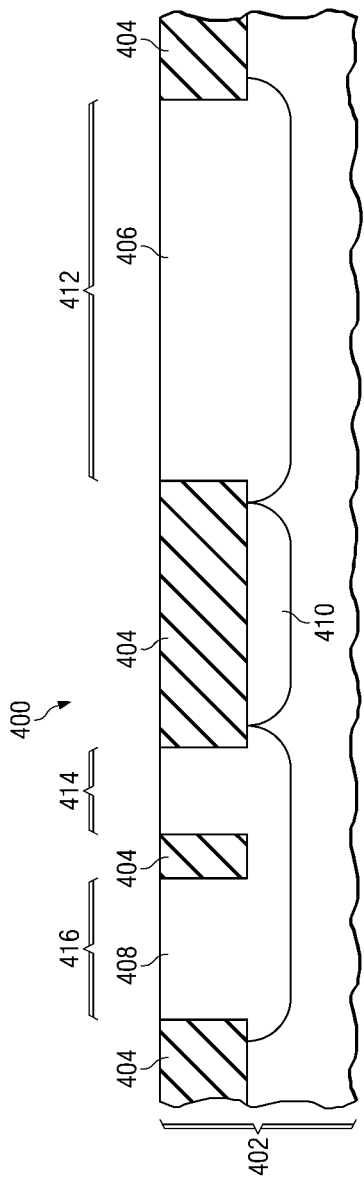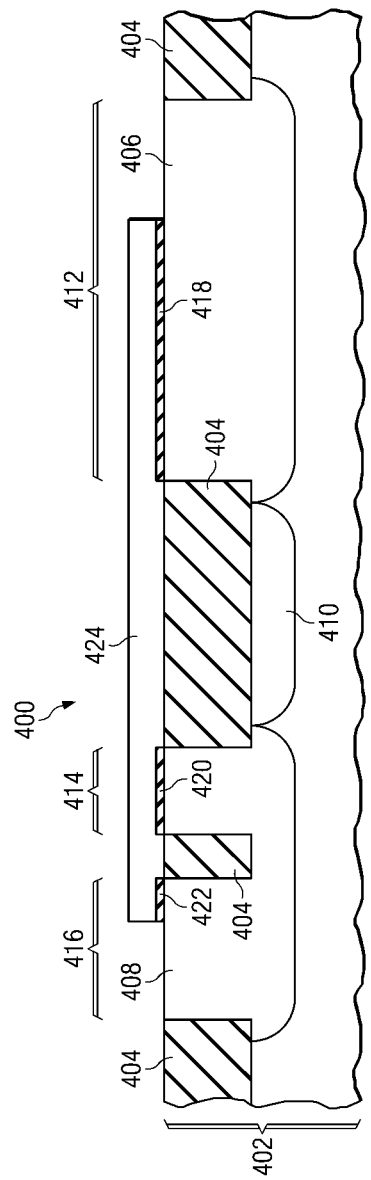

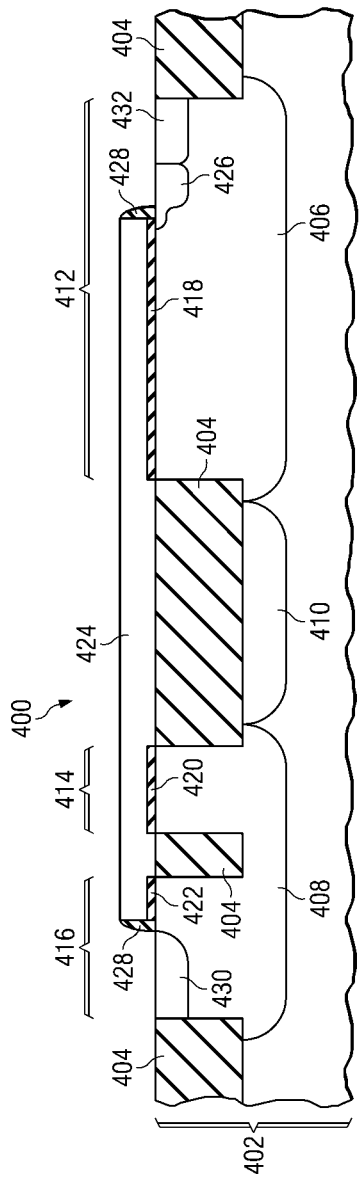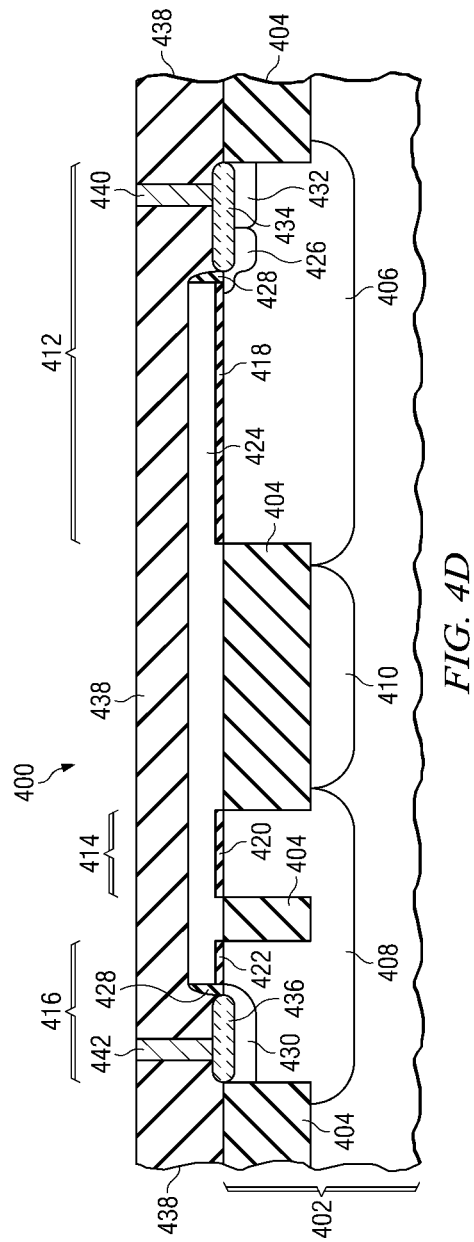
FIG. 4C
FIG. 4D

US 8,946,805 B2

REDUCED AREA SINGLE POLY EEPROM

FIELD OF THE INVENTION

This invention relates to the field of integrated circuits. More particularly, this invention relates to electrically erasable programmable read-only memory (EEPROM) cells in integrated circuits.

DESCRIPTION OF THE VIEWS OF THE DRAWING

FIG. 2A through FIG. 2D are cross-sections of a single poly EEPROM cell formed in an IC according to the first embodiment and depicted in successive stages of fabrication.

FIG. 4A through FIG. 4D are cross-sections of a single poly EEPROM cell formed in an IC according to the second embodiment and depicted in successive stages of fabrication.

DETAILED DESCRIPTION

Figure 1A:
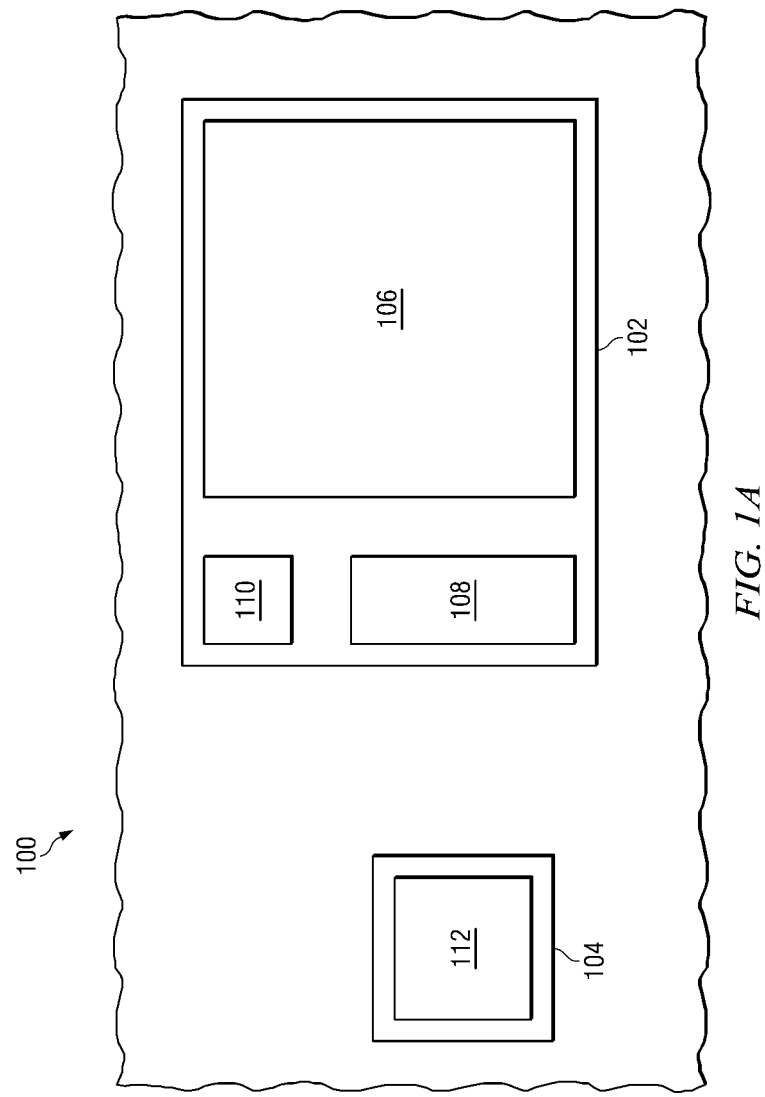
FIG. 1A through FIG. 1F are top views of a single poly EEPROM cell formed in an integrated circuit (IC) according to a first embodiment and depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a single polycrystalline silicon gate electrically erasable programmable read-only memory (single poly EEPROM) cell in an integrated circuit (IC) in which a read metal oxide semiconductor (MOS) transistor is integrated in a control gate well or an erase gate well. The single poly EEPROM cell described herein has a smaller area than single poly EEPROM cell with segregated read MOS transistors.

FIG. 1A through FIG. 1D are top views of a single poly EEPROM cell formed in an IC according to a first embodiment, depicted in successive stages of fabrication. Referring to FIG. 1A, the IC (100) includes a control gate n-type well region known as a control gate n-well (102) and an erase gate n-well (104). They are typically formed by defining n-well areas on a top surface of the IC (100) with an n-well photoresist pattern which exposes the n-well areas and then ion implanting an n-well set of n-type dopants (typically phosphorus and possibly arsenic). The control gate n-well (102) and the erase gate n-well (104) are isolated by a p-type substrate of the IC (100), which is preferably augmented by a p-type well region, commonly known as a p-well. They are typically formed by defining p-well areas on the top surface of the IC (100) with a p-well photoresist pattern which exposes the p-well areas and then ion implanting a p-well set of p-type dopants (typically boron) that surround the two n-wells (102, 104). A lateral separation between the control gate n-well (102) and the erase gate n-well (104) must be sufficient to withstand potential differences between the two n-wells (102, 104) during program and erase operations, typically 10 to 15 volts. The optimal lateral separation between the two n-wells (102, 104) also depends on the n-type dopant density of the n-wells (102, 104) and the p-type dopant density of the intervening p-type material.

Still referring to FIG. 1A, a layer of field oxide is formed at a top surface of the substrate of the IC (100). Typically the layer of field oxide is silicon dioxide that is between 250 and 600 nanometers thick. It is commonly formed by shallow trench isolation (STI) or local oxidation of silicon (LOCOS) processes. In STI processes, the silicon dioxide layer may be deposited by high density plasma (HDP) or high aspect ratio process (HARP). Openings in the field oxide define a control gate active area (106), a read transistor active area (108) and an optional auxiliary control n-well tap active area (110) in the control gate n-well (102). Additional openings in the field oxide define an erase gate active area (112) in the erase gate n-well (104).

Figure 1B:
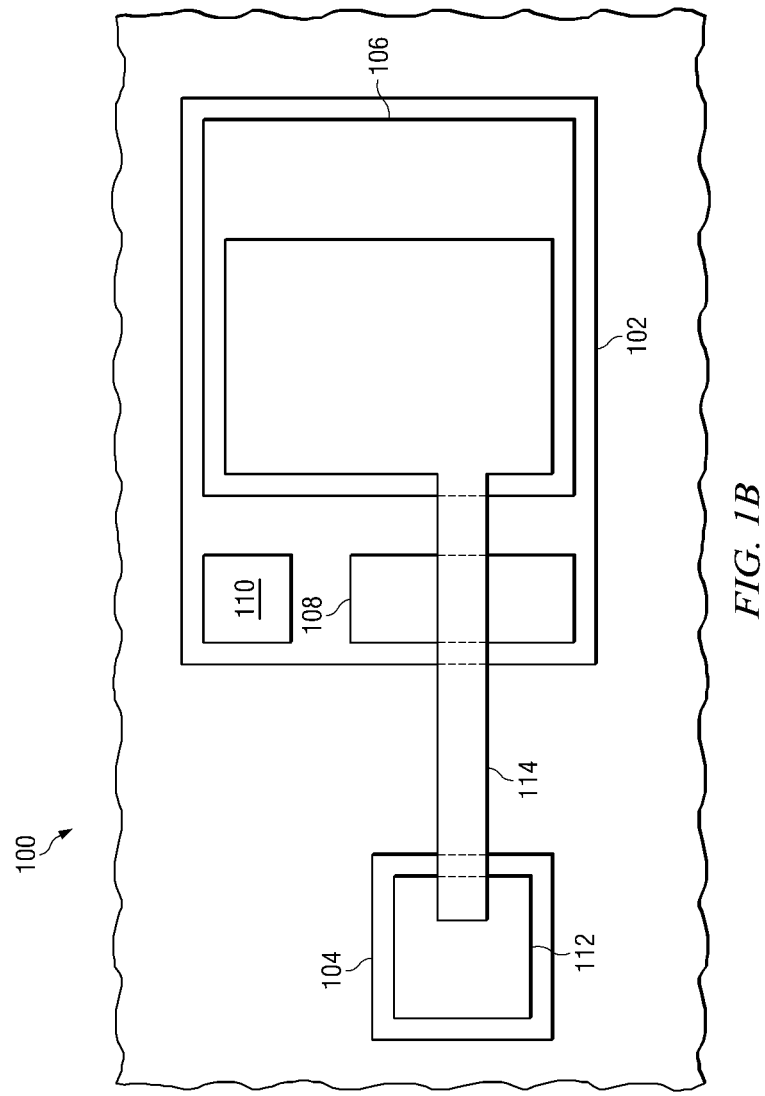

FIG. 1B depicts the IC (100) after formation of a gate structure in the EEPROM cell. A control gate dielectric layer (not shown in FIG. 1B for clarity but discussed in reference to FIG. 2B below) is formed on a top surface of the control gate active area (106). Typically, it is silicon dioxide, nitrogen doped silicon dioxide, silicon oxy-nitride, hafnium oxide, layers of silicon dioxide and silicon nitride, or other insulating material, and it is commonly between 5 and 15 nanometers thick. Similarly, a read transistor gate dielectric layer and an erase gate dielectric layer (also not shown in FIG. 1B for clarity) are formed on top surfaces of the read transistor active area (108) and auxiliary control n-well tap active area (110), respectively. A floating gate (114) (typically polycrystalline silicon—known as polysilicon) is formed on the top surfaces of the control gate dielectric layer, read transistor gate dielectric layer and erase gate dielectric layer, and on a top surface of the field oxide between the control gate active area (106) and the read transistor active area (108), and between the read transistor active area (108) and the erase gate active area (112). The floating gate (114) is typically formed by depositing a layer of polysilicon on the top surface of the IC (100), defining an area for the floating gate (114) with a gate photoresist pattern, and then removing unwanted portions of the polysilicon layer using known etching methods. An overlap area of the floating gate (114) over the control gate active area (106) is typically more than ten times an overlap area of the floating gate (114) over the erase gate active area (112), following known methods of single poly EEPROM cell layout. A width of the floating gate (114) over the read transistor active area (108) is selected to provide desired levels of on-state current and off-state leakage in a read transistor, according to known methods of transistor layout.

Figure 1C:
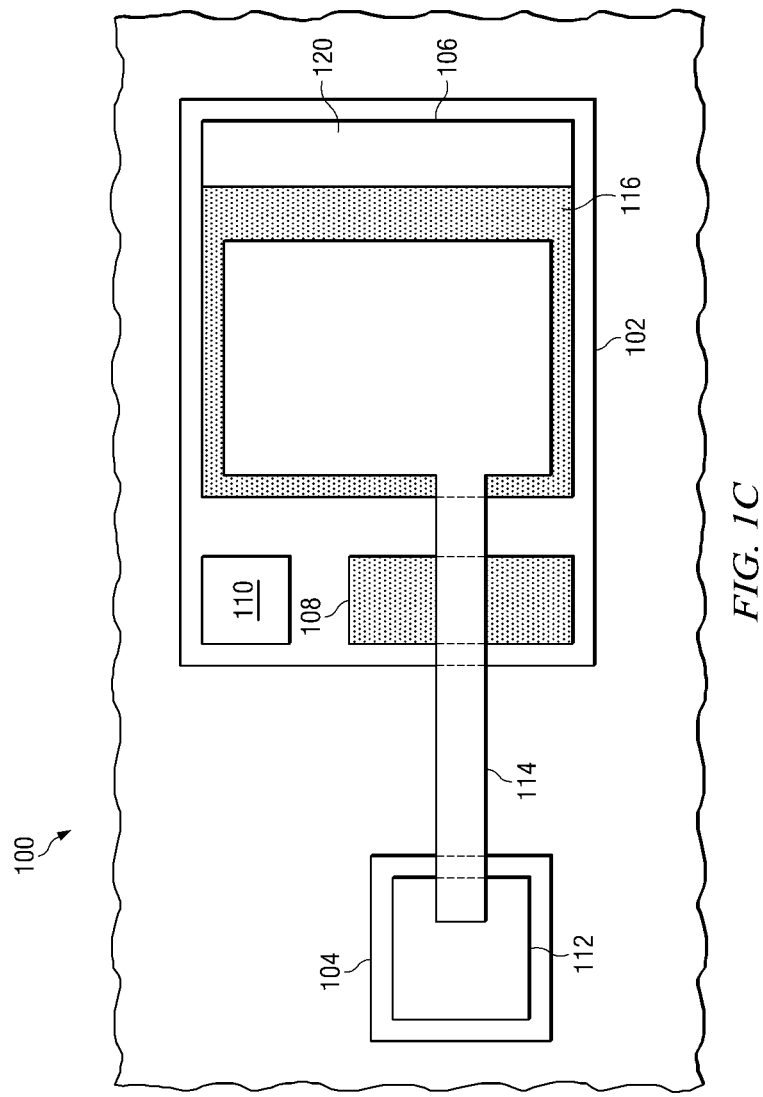

FIG. 1C depicts the IC (100) at a subsequent stage of fabrication. Regions for ion implanting a p-type lightly doped drain (PLDD) set of p-type dopants are defined on a top surface of the IC (100) by a PLDD photoresist pattern (not shown in FIG. 1C for clarity). The PLDD photoresist pattern exposes the read transistor active area (108) and a control gate minority carrier supply region (116) in the control gate active area (106) adjacent to the floating gate (114). The areas exposed by the patterned PLDD photoresist pattern are depicted with the dotted fill pattern in FIG. 1C (to clarify those areas of the control gate n-well 102 that are implanted). The PLDD set of dopants (typically boron (commonly in the form $BF_2$) and possibly gallium and/or indium) are ion implanted into the regions defined by the PLDD photoresist pattern. The implantation process is commonly at a total dose between $1 \cdot 10^{14}$ and $1 \cdot 10^{15}$ atoms/cm$^2$ and commonly to a depth between 2 and 20 nanometers.

Figure 1D:
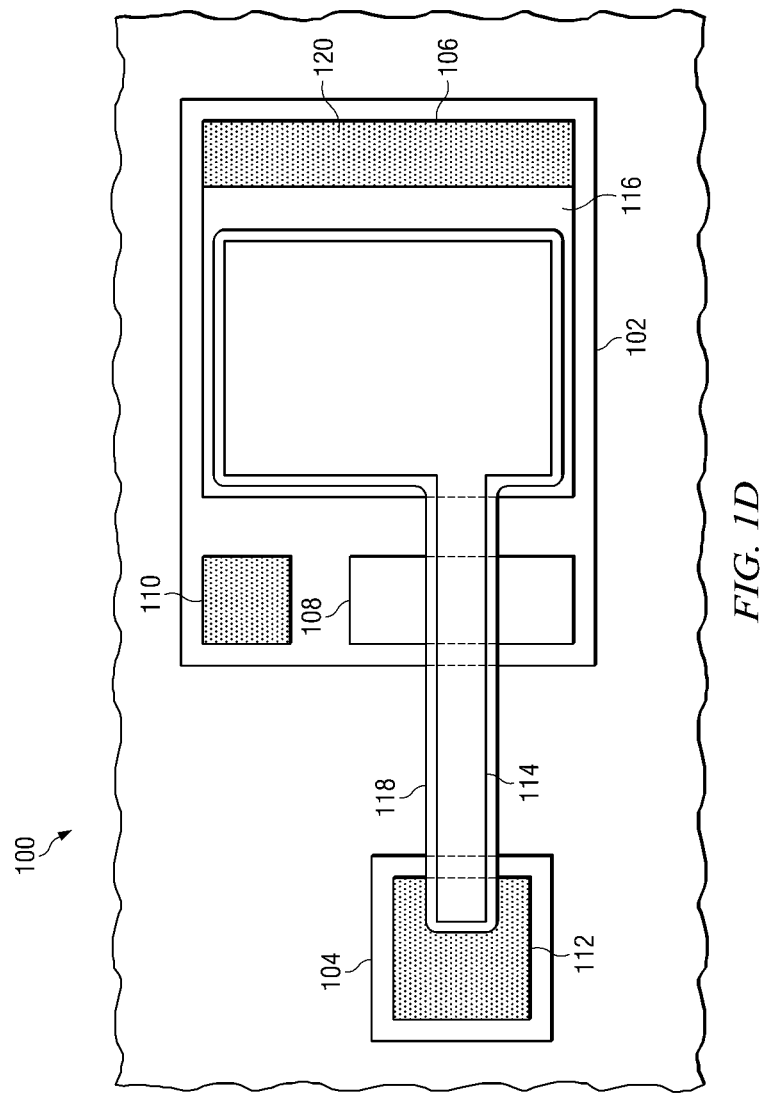

Referring to FIG. 1D, a gate sidewall spacer (118) is formed on lateral surfaces of the floating gate (114). The gate sidewall spacer (118) is typically formed by depositing one or more conformal layers of silicon nitride (and possibly one or more conformal layers of silicon dioxide) on the top and lateral surfaces of the floating gate (114). The deposition process is followed by an anisotropic etch process which removes conformal layer material from the top surface of the floating gate (114); leaving the gate sidewall spacer (118) on the lateral surfaces of the floating gate (114). Next, regions for ion implanting an n-tap set of n-type dopants are defined on the top surface of the IC (100) by an n-tap photoresist pattern (not shown in FIG. 1C for clarity). The n-tap photoresist pattern exposes the erase gate active area (112), the auxiliary control n-well tap active area (110) and a control gate tap region (120) in the control gate active area (106) proximate to—but not adjacent to—the floating gate (114). The areas of the control gate n-well 102 and erase gate n-well 104 that are implanted are depicted with a dotted fill pattern in FIG. 1D. The n-tap set of n-type dopants (typically phosphorus and arsenic (and possible antimony)) are ion implanted into the regions defined by the n-tap photoresist pattern. The implant process is commonly at a total dose between $3 \cdot 10^{14}$ and $1 \cdot 10^{16}$ atoms/cm$^2$ and to a depth between 20 and 100 nanometers in the erase gate active area (112) adjacent to the floating gate (114), in the auxiliary control n-well tap active area (110), and in the control gate tap region (120). It is common to perform the n-tap ion implantation process concurrently with an n-type source and drain ion implantation process for n-channel metal oxide semiconductor (NMOS) transistors that are located elsewhere in the IC (100).

Figure 1E:
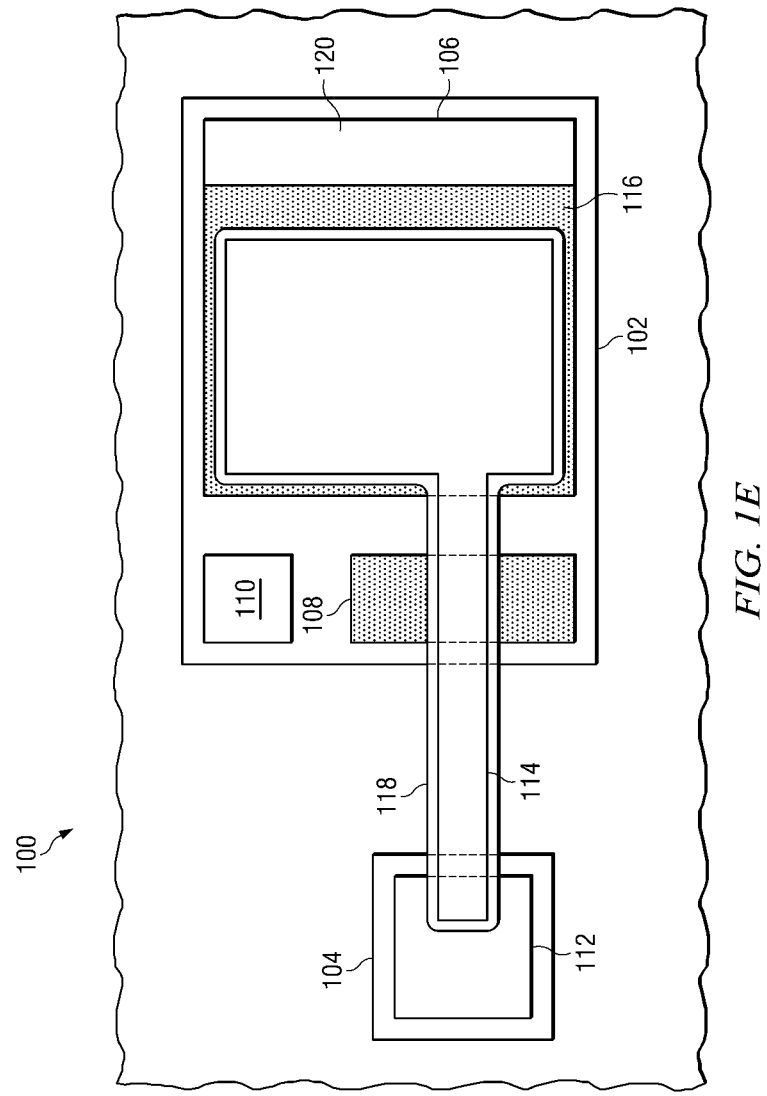

Referring to FIG. 1E, regions for ion implanting a p-type source/drain (PSD) set of p-type dopants are defined on the top surface of the IC (100) by a PSD photoresist pattern (not shown in FIG. 1C for clarity) such that the read transistor active area (108) and the control gate minority carrier supply region (116) are exposed. The areas of the control gate n-well 102 and erase gate n-well 104 that are implanted are depicted with a dotted fill pattern in FIG. 1E. The PSD set of p-type dopants (typically boron (commonly in the form $BF_2$) and possibly gallium and/or indium) are ion implanted into the regions defined by the PSD photoresist pattern. The implant is commonly at a total dose between $1 \cdot 10^{15}$ and $1 \cdot 10^{16}$ atoms/cm$^2$ and to a depth between 20 and 250 nanometers. It is common to perform the PSD ion implantation process concurrently with the ion implantation of p-type source and drain regions for p-type metal oxide semiconductor (PMOS) transistors that are located elsewhere in the IC (100). An anneal process may now be performed on the IC (100) to activate and diffuse a portion of the PLDD dopants, n-tap dopants, and PSD dopants in the IC (100).

Figure 1F:
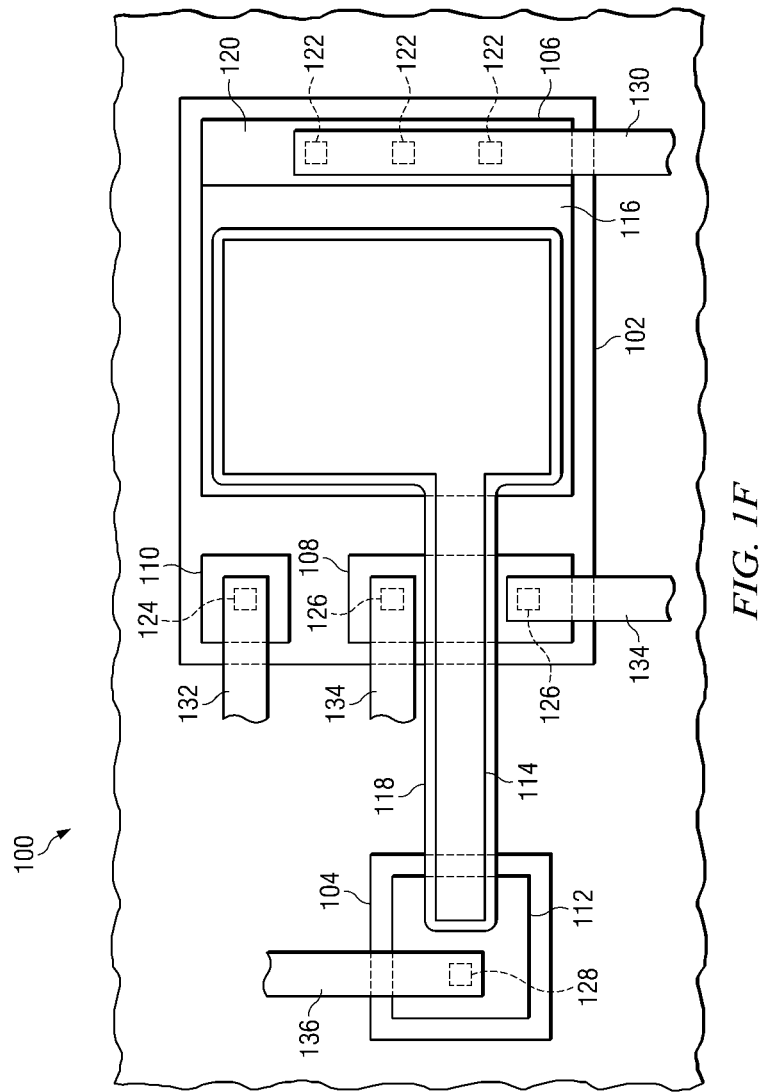

FIG. 1F depicts the IC (100) after the formation of a first level of metal interconnects. Metal silicide (such as titanium silicide, cobalt silicide or nickel silicide) is optionally formed on exposed areas of the top surfaces of the control gate minority carrier supply region (116), the control gate tap region (120), the read transistor active area (108), the auxiliary control n-well tap active area (110) and the erase gate active area (112). The metal silicide is commonly formed by depositing a layer of metal (such as titanium, cobalt, or nickel) on a top surface of the IC (100) and then heating the IC (100) to react a portion of the metal with exposed silicon in active areas of the IC (100). The unreacted metal is removed from the IC (100) surface; commonly by exposing the IC (100) to wet etchants (including a mixture of an acid and hydrogen peroxide).

In an alternate embodiment, a layer of silicide block dielectric is formed on the exposed areas of the top surfaces of the control gate minority carrier supply region (116), the control gate tap region (120), the read transistor active area (108), the auxiliary control n-well tap active area (110) and the erase gate active area (112), preventing formation of metal silicide. Then a pre-metal dielectric (PMD) layer (not shown in FIG. 1F for clarity) that may be a dielectric layer stack including a silicon nitride or silicon dioxide PMD liner (10 to 100 nanometers thick deposited by plasma enhanced chemical vapor deposition (PECVD)), a layer of silicon dioxide, phospho-silicate glass (PSG) or boro-phospho-silicate glass (BPSG) (possibly 100 to 1000 nanometers thick deposited by PECVD, and possibly leveled by a chemical-mechanical polish (CMP) process), and an optional PMD cap layer (possibly 10 to 100 nanometers of a hard material such as silicon nitride, silicon carbide nitride or silicon carbide), is formed on the top surface of the IC (100).

Continuing to refer to FIG. 1F, one or more control gate tap contacts (122) are formed in the PMD layer to make electrical connections to the control gate tap region (120). In addition, an auxiliary control n-well tap contact (124) is formed in the PMD layer to make electrical connections to the optional auxiliary control n-well tap active area (110) if present. Furthermore, read transistor source and drain contacts (126) are formed in the PMD layer to make electrical connections to source and drain regions of the read transistor active area (108), and an erase gate n-well contact (128) is formed in the PMD layer to make an electrical connection to the erase gate active area (112). Contacts are formed by defining contact areas on a top surface of the PMD layer with a contact photoresist pattern (not shown in FIG. 1D for clarity), etching contact holes in the contact areas by removing PMD layer material using known etching methods to expose underlying layers, filling the contact holes with a contact liner metal (such as titanium, and a contact fill metal, typically tungsten), then removing the contact fill metal from the top surface of the PMD layer using known etching and/or CMP methods.

Still referring to FIG. 1F, metal interconnect elements (typically of aluminum or copper) are formed on the top surface of the PMD layer to electrically connect the elements of the single poly EEPROM cell to other circuits (not shown in FIG. 1D for clarity) in the IC (100). The metal interconnect elements include a control gate n-well bias interconnect (130) that connects to the control gate tap contacts (122), an auxiliary control n-well bias interconnect (132) which connects to the auxiliary control n-well tap contact (124) of the auxiliary control n-well tap active area (110), if present, and which may be directly connected to the control gate n-well bias interconnect (130), read transistor source and drain interconnects (134) which connect to the source and drain contacts (126), and an erase gate n-well bias interconnect (136) which connects to the erase gate n-well contact (128). The metal interconnect elements are typically aluminum or copper and they are typically formed on the top surface of the PMD layer to electrically connect the single poly EEPROM cell to other circuits in the IC (100) (not shown). The aluminum interconnects are typically formed by first depositing a layer of aluminum (50 to 200 nanometers thick) on the top surface of the PMD layer, thereby making electrical connections to top surfaces of the contacts. Then interconnect areas are defined with an interconnect photoresist pattern and the unwanted aluminum is removed (using known etching methods). A suitable liner metal may be formed on all surfaces of the aluminum interconnects to improve reliability. The spaces between the aluminum interconnects are filled with a dielectric material (possibly organo-silicate glass (OSG), carbon-doped silicon oxides (SiCO or CDO) or methylsilsesquioxane (MSQ)) to form an intra-metal dielectric (IMD) layer. The copper interconnects are typically formed by a multistep process that includes depositing an IMD layer on the top surface of the PMD layer, defining interconnect areas with an interconnect photoresist pattern, etching interconnect trenches in the IMD layer to expose the top surfaces of the contacts, depositing a liner metal (such as tantalum nitride) in the interconnect trenches and on a top surface of the IMD layer, depositing copper on the top surface of the liner metal to fill the interconnect trenches, and then selectively removing copper and liner metal from the top surface of the IMD layer using known copper CMP methods.

During a program operation, a ground potential is applied to the erase gate n-well interconnect (136), and a potential sufficient to produce an electron tunneling current through the erase gate dielectric layer (commonly 10 to 20 volts) is applied to the control gate n-well bias interconnect (130) and to the auxiliary control n-well bias interconnect (132), if present. Due to the overlap area of the floating gate (114) over the control gate active area (106) being more than an overlap area of the floating gate (114) over the erase gate active area (112), a large fraction (approximately equal to a ratio of the overlap area of the floating gate (114) over the control gate active area (106) to a sum of the overlap area of the floating gate (114) over the control gate active area (106) and the overlap area of the floating gate (114) over the erase gate active area (112)) of the potential applied to the control gate n-well bias interconnect (130) is generated across the erase gate dielectric layer. This results in electrons from the erase gate active area (112) tunneling to the floating gate (114). Because the read transistor active area (108) is integrated in the control gate n-well (102), a desirably small fraction (approximately equal to a ration of the overlap area of the floating gate (114) over the erase gate active area (112) to a sum of the overlap area of the floating gate (114) over the control gate active area (106) and the overlap area of the floating gate (114) over the erase gate active area (112)) of the potential applied to the control gate n-well bias interconnect (130) is generated across the read transistor gate dielectric layer. The potentials on the control gate n-well bias interconnect (130) and the auxiliary control n-well bias interconnect (132) are lowered to ground, resulting in the electrons which tunneled to the floating gate (114) producing an inversion layer in the read transistor active area (108).

Integration of the read transistor active area (108) in the control gate n-well (102) allows a desirable reduction in a total area of the inventive single poly EEPROM cell compared to cells with segregated read transistors. This configuration allows a backgate region of the read transistor to track a potential of the control gate n-well (102), thereby eliminating a need to prevent breakdown during a program operation by separating the read transistor from the control gate n-well (102) a distance that is greater than a depletion region of the control gate n-well (102).

During an erase operation, a ground potential is applied to the control gate n-well bias interconnect (130) and to the auxiliary control n-well bias interconnect (132), if present, while a potential sufficient to produce electron tunneling current through the control gate dielectric layer (also typically 10 to 20 volts) is applied to the erase gate n-well interconnect (136). Due to the overlap area of the floating gate (114) over the control gate active area (106) being more than an overlap area of the floating gate (114) over the erase gate active area (112), a large fraction (approximately equal to a ratio of the overlap area of the floating gate (114) over the control gate active area (106) to a sum of the overlap area of the floating gate (114) over the control gate active area (106) and the overlap area of the floating gate (114) over the erase gate active area (112)) of the potential applied to the erase gate n-well interconnect (136) is generated across the erase gate dielectric layer, resulting in electrons from the floating gate (114) tunneling to the erase gate active area (112). Because the read transistor active area (108) is integrated in the control gate n-well (102), a desirably small fraction (approximately equal to a ration of the overlap area of the floating gate (114) over the erase gate active area (112) to a sum of the overlap area of the floating gate (114) over the control gate active area (106) and the overlap area of the floating gate (114) over the erase gate active area (112)) of the potential applied to the erase gate n-well interconnect (136) is generated across the read transistor gate dielectric layer. The potential on the erase gate n-well interconnect (136) is lowered to ground, resulting in a potential on the floating gate (114) that is approximately equal to ground potential, thereby producing an accumulation layer in the read transistor active area (108).

Integration of the read transistor active area (108) in the control gate n-well (102) may be beneficial because the stress on the read transistor gate dielectric layer is symmetric (i.e. positive during a program operation and negative during an erase operation) and the stress is significantly reduced in magnitude compared to single poly EEPROM cells with segregated read transistors, which experience asymmetric stress (e.g. strongly positive during a program operation while weakly negative during an erase operation). As a result, read transistors that are integrated in control gate n-wells may be expected to exhibit more reliable read transistor operation than segregated read transistors. The symmetric and low stress level on the read transistor gate dielectric layer enables the use of the same dielectric layer for the read transistor gate dielectric layer and the control gate dielectric layer, possibly providing a reduction in fabrication cost and complexity compared to ICs with segregated read transistors that use thicker gate dielectric layers.

The inclusion of the optional auxiliary control n-well tap active area (110) may also be beneficial because a voltage drop across the control gate n-well may be reduced. It is to be noted that alternate embodiments in which the read transistor is positioned on another side of the control gate n-well are within the scope of the instant invention.

In another alternate embodiment, a p-type erase gate minority carrier supply region may be formed adjacent to the overlap area of the floating gate (114) over the erase gate active area (112) by ion implanting the PLDD and PSD sets of p-type dopants. The addition of an erase gate minority carrier supply region may provide a more rapid formation of an inversion layer under the floating gate in the erase active area during an erase cycle, thus enabling a shorter erase cycle.

FIG. 2A through FIG. 2D are cross-sections of a single poly EEPROM cell formed in an IC according to the first embodiment of the instant invention, depicted in successive stages of fabrication. Referring to FIG. 2A, the IC (200) is formed in a substrate (202) which is typically p-type single crystal silicon but may be any semiconductor substrate suitable for fabrication of the IC (200). Elements of field oxide (204) are formed in a top region of the substrate (202), as described in reference to FIG. 1A, to isolate elements of the single poly EEPROM cell. A control gate n-well (206) and an erase gate n-well (208) are formed in the substrate (202) as described in reference to FIG. 1A. A p-well (210) is formed in the substrate (202), as described in reference to FIG. 1A, between the control gate n-well (206) and the erase gate n-well (208). The p-well (if present) may be formed by forming a p-well photoresist pattern (not shown) on the IC (200) to define an area between the control gate n-well (206) and the erase gate n-well (208). P-type dopants (such as boron) are then ion implanted into the substrate (202) through the openings in the p-well photoresist pattern. The lateral separation between the control gate n-well (206) and the erase gate n-well (208) must be sufficient to withstand potential differences between the two n-wells (206, 208) during program and erase operations (typically 10 to 20 volts). The lateral separation between the two n-wells (206, 208) is also a function of the n-type dopant density of the n-wells (206, 208) and the p-type dopant density of the intervening p-well (210). Openings between the field oxide elements (204) define a control gate active area (212) and a read transistor active area (214) in the control gate n-well (206). Openings between the field oxide elements (204) also define an erase gate active area (216) in the erase gate n-well (208).

FIG. 2B depicts the IC (200) after formation of a gate structure in the EEPROM cell. A control gate dielectric layer (218) is formed on a top surface of the control gate active area (212). The control gate dielectric layer (218) may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The control gate dielectric layer (218) may include nitrogen as a result of exposure to a nitrogen containing plasma or nitrogen containing ambient gas at temperatures between 50 C and 800 C. The control gate dielectric layer (218) may be between 5 and 15 nanometers thick. The control gate dielectric layer (218) may be formed by any of a variety of gate dielectric formation processes, for example thermal oxidation, plasma nitridation of an oxide layer, and/or dielectric material deposition by atomic layer deposition (ALD). Similarly, a read transistor gate dielectric layer (220) and an erase gate dielectric layer (222) are formed on the top surfaces of the read transistor active area (214) and erase gate active area (216), respectively. A floating gate (224) (typically polysilicon) is formed on the top surfaces of the control gate dielectric layer (218), the read transistor gate dielectric layer (220) and the erase gate dielectric layer (222). The floating gate (224) is formed on a top surface of the field oxide elements (204) between the control gate active area (212) and the read transistor active area (214), and between the read transistor active area (214) and the erase gate active area (216). An overlap area of the floating gate (224) over the control gate active area (212) is typically more than ten times an overlap area of the floating gate (224) over the erase gate active area (216), as described in reference to FIG. 1B. The width of the floating gate (224) over the read transistor active area (214) is selected to provide the desired levels of on-state current and off-state leakage in a read transistor (according to known methods of transistor layout).

FIG. 2C depicts the IC (200) at a subsequent stage of fabrication. A PLDD set of p-type dopants is ion implanted into the top regions of the read transistor active area (214) on each side of the floating gate (224) and into a control gate minority carrier supply region (226) in the control gate active area (212) adjacent to the floating gate (224), as described in reference to FIG. 1C. PLDD implanted regions in the read transistor active area (214) are out of the plane of FIG. 2C, and hence is not shown in FIG. 2C for clarity. A gate sidewall spacer (228) is formed on lateral surfaces of the floating gate (224) as described in reference to FIG. 1C. An n-tap set of n-type dopants is ion implanted into the erase gate active area (216) adjacent to the floating gate (224) and into a control gate tap region in the control gate active area (212) proximate to, but not adjacent to, the floating gate (224), to form an erase gate tap diffused region (230) and a control gate tap diffused region (232), respectively. A PSD set of p-type dopants is ion implanted into the top regions of the read transistor active area (214) on each side of the floating gate (224) and into the control gate minority carrier supply region (226) in the control gate active area (212) adjacent to the floating gate (224), as described in reference to FIG. 1C. The PSD implant regions in the read transistor active area (214) are out of the plane of FIG. 2C, and hence are not shown in FIG. 2C for clarity. An anneal process is subsequently performed on the IC (200) to activate and diffuse a portion of the PLDD dopants, n-tap dopants and PSD dopants in the IC (200).

Referring to FIG. 2D, an optional control n-well tap metal silicide layer (234) is formed on top surfaces of the control gate minority carrier supply region (226) and control gate tap diffused region (232). Similarly, an optional erase gate n-well tap metal silicide layer (236) is formed on a top surface of the erase gate tap diffused region (230), as described in reference to FIG. 1D. Additionally, optional metal silicide layers are formed on the top surfaces of source and drain regions of the read transistor active area (214) on each side of the floating gate (224). The source and drain regions of the read transistor active area (214) are out of the plane of FIG. 2D, and hence are not shown in FIG. 2D for clarity. A PMD layer (238) is formed on the top surface of the IC (200), as described in reference to FIG. 1F. A control gate tap contact (240) and an erase gate n-well contact (242) are formed in the PMD layer (238), as described in reference to FIG. 1F, to make electrical connections to the control gate minority carrier supply region (226) and control gate tap diffused region (232) or the erase gate tap diffused region (230), respectively (through the optional silicide layers (234, 236), if present). Read transistor source and drain contacts are also formed in the PMD layer (238) to make electrical connections to the read transistor source and drain regions, but are not in the plane of FIG. 2D and are not shown in FIG. 2D for clarity.

Figure 3A:
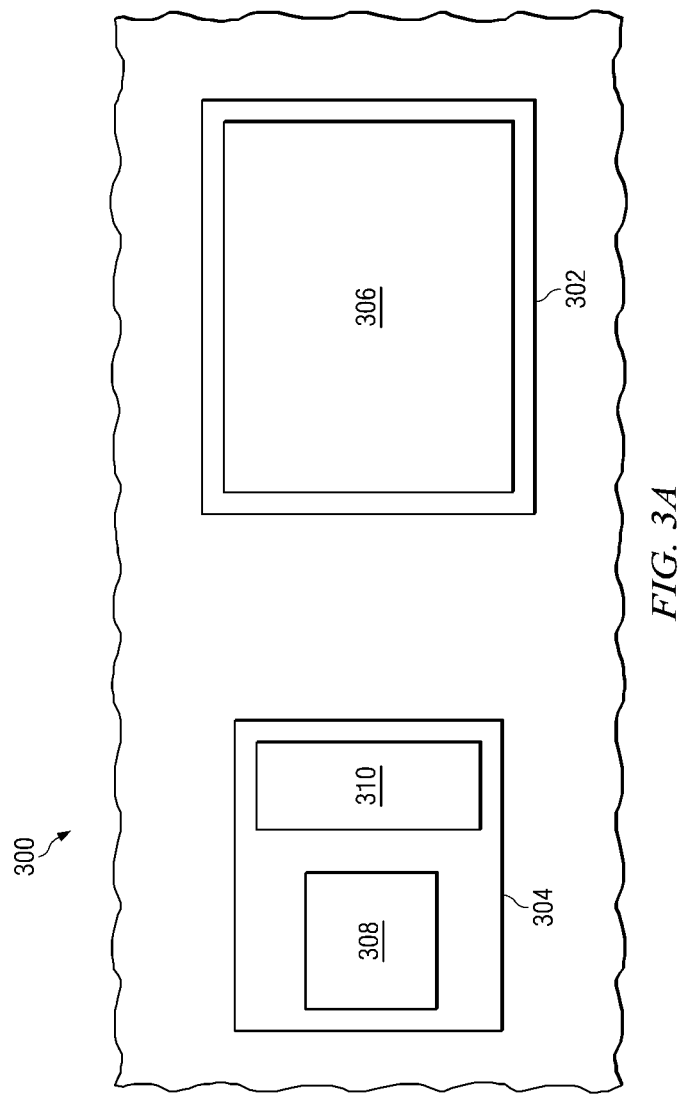
FIG. 3A through FIG. 3D are top views of a single poly EEPROM cell formed in an IC according to a second embodiment and depicted in successive stages of fabrication.

FIG. 3A through FIG. 3D are top views of a single poly EEPROM cell formed in an IC according to a second embodiment of the instant invention, depicted in successive stages of fabrication. Referring to FIG. 3A, the IC (300) includes a control gate n-well (302) and an erase gate n-well (304), typically formed as described in reference to FIG. 1A. The control gate n-well (302) and the erase gate n-well (304) are isolated by a p-type substrate of the IC (300), which is preferably augmented by a p-well, typically formed as described in reference to FIG. 2A. A lateral separation between the control gate n-well (302) and the erase gate n-well (304) must be sufficient to withstand potential differences between the two n-wells (302, 304) during program and erase operations (typically 10 to 15 volts). The lateral separation between the two n-wells (302, 304) is also a function of an n-type dopant density of the n-wells (302, 304) and a p-type dopant density of the intervening p-type material. Field oxide is formed at a top surface of the substrate of the IC (300) to define and isolate a control gate active area (306) in the control gate n-well (302). Field oxide is formed at a top surface of the substrate of the IC (300) to define and isolate an erase gate active area (308) and a read transistor active area (310) in the erase gate n-well (304).

Figure 3B:
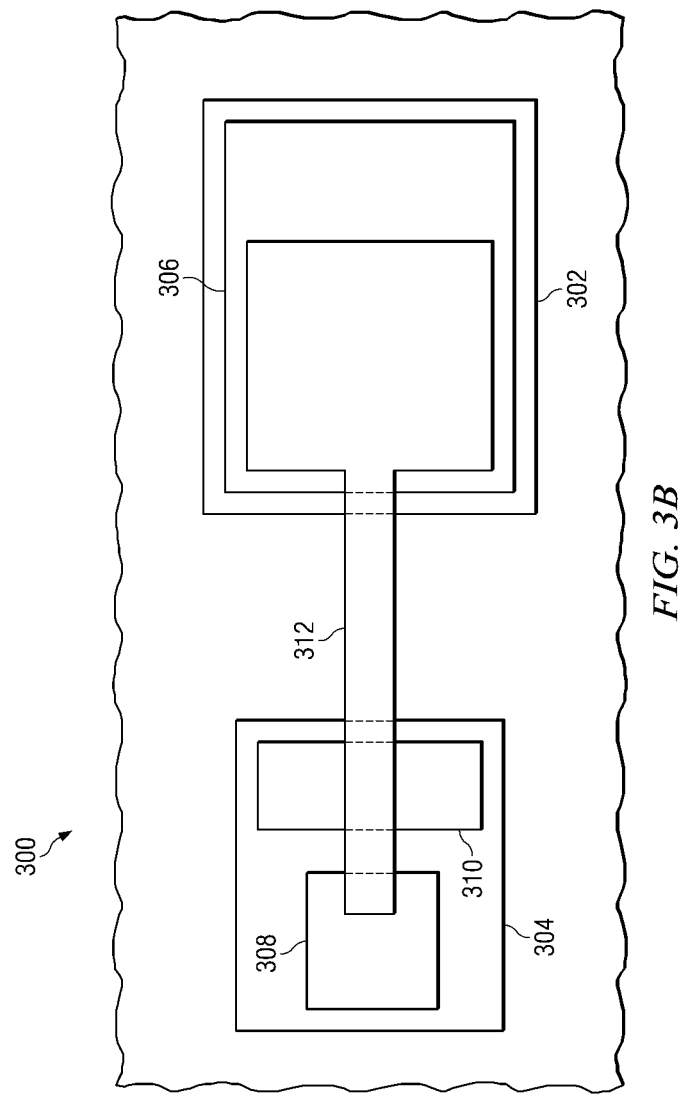

FIG. 3B depicts the IC (300) after formation of a gate structure in the EEPROM cell. A control gate dielectric layer, a read transistor gate dielectric layer and an erase gate dielectric layer not shown in FIG. 3B for clarity, are formed (as described in reference to FIG. 2B) on top surfaces of the control gate active area (306), the read transistor active area (310) and erase gate active area (308), respectively. A floating gate (312), is formed (as described in reference to FIG. 1B) on top surfaces of the control gate dielectric layer, read transistor gate dielectric layer and erase gate dielectric layer, and on a top surface of the field oxide between the control gate active area (306) and the read transistor active area (310), and between the read transistor active area (310) and the erase gate active area (308). An overlap area of the floating gate (312) over the control gate active area (306) is typically more than ten times an overlap area of the floating gate (312) over the erase gate active area (308) (following known methods of single poly EEPROM cell layout). A width of the floating gate (312) over the read transistor active area (310) is selected to provide desired levels of on-state current and off-state leakage in a read transistor (according to known methods of transistor layout).

Figure 3C:
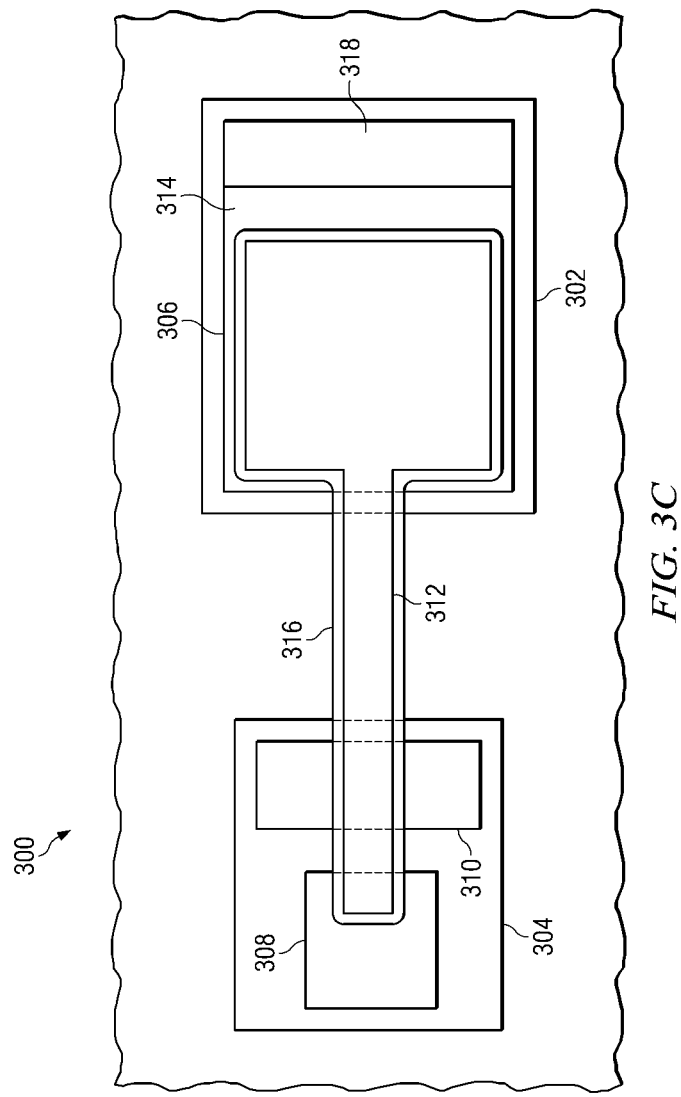

FIG. 3C depicts the IC (300) at a subsequent stage of fabrication. A PLDD set of p-type dopants is ion implanted into the read transistor active area (310) on each side of the floating gate (312) and into a control gate minority carrier supply region (314) in the control gate active area (306) adjacent to the floating gate (312) (as described in reference to FIG. 1C). A gate sidewall spacer (316) is formed on lateral surfaces of the floating gate (312) (as described in reference to FIG. 1C). An n-tap set of n-type dopants is ion implanted (as described in reference to FIG. 1C) into the erase gate active area (308) adjacent to the floating gate (312) and into a control gate tap region (318) in the control gate active area (306) proximate to, but not adjacent to, the floating gate (312). A PSD set of p-type dopants is ion implanted (as described in reference to FIG. 1C) into top regions of the read transistor active area (310) on each side of the floating gate (312) and into the control gate minority carrier supply region (314) in the control gate active area (306) adjacent to the floating gate (312). An anneal process is subsequently performed on the IC (300) to activate and diffuse a portion of the PLDD dopants, n-tap dopants and PSD dopants in the IC (300).

Figure 3D:
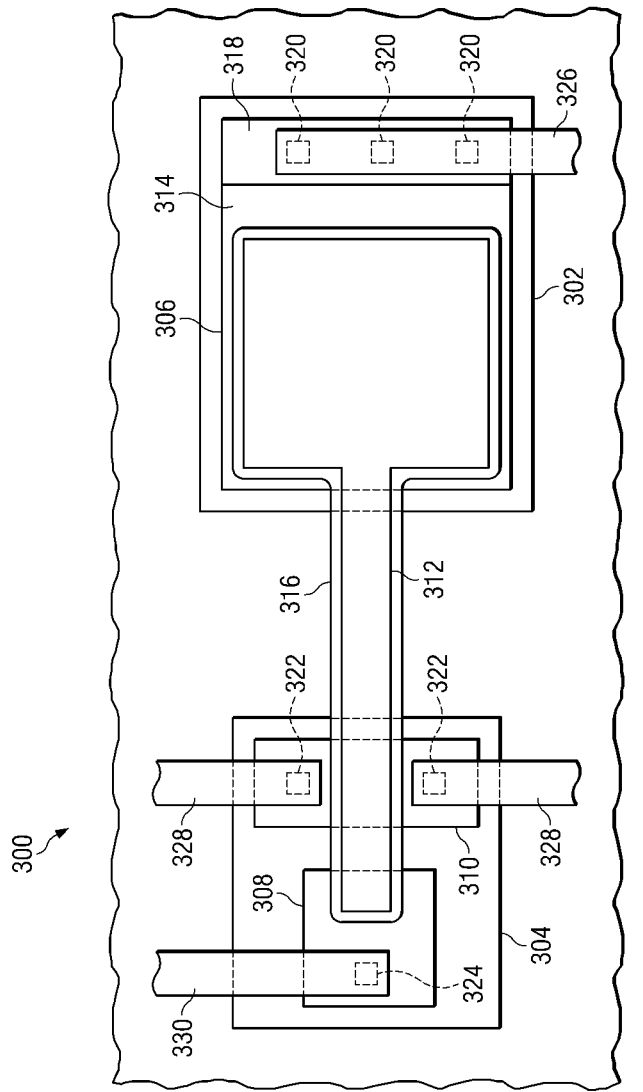

FIG. 3D depicts the IC (300) after formation of a first level of metal interconnects in the IC (300). Metal silicide is optionally formed on exposed areas of the top surfaces of the control gate minority carrier supply region (314), the control gate tap region (318), the read transistor active area (310), and the erase gate active area (308) (as described in reference to FIG. 1F). A PMD layer is then formed on a top surface of the IC (300) (as described in reference to FIG. 1F). One or more control gate tap contacts (320) are subsequently formed in the PMD layer to make electrical connections to the control gate tap region (318), read transistor source and drain contacts (322) are formed in the PMD layer to make electrical connections to source and drain regions of the read transistor active area (310), and an erase gate n-well contact (324) is formed in the PMD layer to make an electrical connection to the erase gate active area (308). The contacts (320, 322, 324) are formed as described in reference to FIG. 1F. A control gate n-well bias interconnect (326) which connects to the control gate tap contacts (320), read transistor source and drain interconnects (328) which connect to the source and drain contacts (322), and an erase gate n-well bias interconnect (330) which connects to the erase gate n-well contact (324) are formed (as described in reference to FIG. 1F) on the top surface of the PMD layer to electrically connect the elements of the EEPROM cell to other circuits (not shown in FIG. 3D for clarity) in the IC (300).

Still referring to FIG. 3D, during a program operation, a ground potential is applied to the erase gate n-well bias interconnect (330). Also, a potential sufficient to produce electron tunneling current through the erase gate dielectric layer (commonly 10 to 15 volts) is applied to the control gate n-well bias interconnect (326). Due to the overlap area of the floating gate (312) over the control gate active area (306) being more than an overlap area of the floating gate (312) over the erase gate active area (308), a large fraction (approximately equal to a ratio of the overlap area of the floating gate (312) over the control gate active area (306) to a sum of the overlap area of the floating gate (312) over the control gate active area (306) and the overlap area of the floating gate (312) over the erase gate active area (308)) of the potential applied to the control gate n-well bias interconnect (326) is generated across the erase gate dielectric layer, resulting in electrons from the erase gate active area (308) tunneling to the floating gate (312). Because the read transistor active area (310) is integrated in the erase gate n-well (304), approximately the same potential is generated across the read transistor gate dielectric layer as is generated across the erase gate dielectric layer. The potential on the control gate n-well bias interconnect (326) is then lowered to ground, resulting in the electrons which tunneled to the floating gate (312) producing an inversion layer in the read transistor active area (310).

The integration of the read transistor active area (310) in the erase gate n-well (304) may allow a desirable reduction in a total area of the single poly EEPROM cell compared to cells with segregated read transistors. The reduction in total area is realized because a backgate region of the read transistor tracks the potential of the erase gate n-well (304), thereby eliminating a need to prevent breakdown through the separation of the read transistor from the erase gate n-well (304) by a distance greater than a depletion region of the erase gate n-well (304) during a program operation.

During an erase operation, a ground potential is applied to the control gate n-well bias interconnect (326), and then a potential sufficient to produce electron tunneling current through the control gate dielectric layer (also typically 10 to 20 volts) is applied to the erase gate n-well interconnect (330). Due to the overlap area of the floating gate (312) over the control gate active area (306) being more than an overlap area of the floating gate (312) over the erase gate active area (308), a large fraction (approximately equal to a ratio of the overlap area of the floating gate (312) over the control gate active area (306) to a sum of the overlap area of the floating gate (312) over the control gate active area (306) and the overlap area of the floating gate (312) over the erase gate active area (308)) of the potential applied to the erase gate n-well interconnect (330) is generated across the erase gate dielectric layer, resulting in electrons from the floating gate (312) tunneling to the erase gate active area (308). Because the read transistor active area (310) is integrated in the erase gate n-well (304), approximately the same potential is generated across the read transistor gate dielectric layer as is generated across the erase gate dielectric layer. The potential on the erase gate n-well interconnect (330) is lowered to ground, resulting in a potential on the floating gate (312) being approximately equal to ground potential, thereby producing an accumulation layer in the read transistor active area (310).

The integration of the read transistor into the erase gate n-well causes stress on the read transistor gate dielectric layer to be symmetric (that is positive during a program operation and negative during an erase operation) as compared to asymmetric stress (that is positive during a program operation and essentially zero during an erase operation) in the single poly EEPROM cells with segregated read transistors, possibly resulting in a more reliable read transistor operation. In an alternate embodiment, an optional auxiliary control n-well tap active area may be included to possibly reduce a voltage drop across the control gate n-well. In addition, alternate embodiments in which the read transistor is positioned on another side of the erase gate n-well are within the scope of the instant invention.

In yet another alternate embodiment, a p-type erase gate minority carrier supply region may be formed adjacent to the overlap area of the floating gate over the erase gate active area by ion implanting the PLDD and PSD sets of p-type dopants. The addition of an erase gate minority carrier supply region may provide a more rapid formation of an inversion layer under the floating gate in the erase active area during an erase cycle, thus possibly enabling a shorter erase cycle.

FIG. 4A through FIG. 4D are cross-sections of a single poly EEPROM cell formed in an IC according to the second embodiment of the instant invention and depicted in successive stages of fabrication. Referring to FIG. 4A, the IC (400) is formed in a substrate (402) which is typically p-type single crystal silicon but may be any semiconductor substrate suitable for fabrication of the IC (400). Elements of field oxide (404) are formed in a top region of the substrate (402) (as described in reference to FIG. 1A) to isolate elements of the single poly EEPROM cell. A control gate n-well (406) and an erase gate n-well (408) are formed in the substrate (402) as described in reference to FIG. 1A. A p-well (410) is formed in the substrate (402) (as described in reference to FIG. 1A) between the control gate n-well (406) and the erase gate n-well (408). A lateral separation between the control gate n-well (406) and the erase gate n-well (408) must be sufficient to withstand potential differences between the two n-wells (406, 408) during program and erase operations, typically 10 to 20 volts. The lateral separation between the two n-wells (406, 408) is also a function of an n-type dopant density of the n-wells (406, 408) and a p-type dopant density of the intervening p-well (410). Openings between the field oxide elements (404) define a control gate active area (412) in the control gate n-well (406). Openings between the field oxide elements (404) also define and a read transistor active area (414) and an erase gate active area (416) in the erase gate n-well (408).

FIG. 4B depicts the IC (400) after formation of a gate structure in the EEPROM cell. A control gate dielectric layer (418) is formed on a top surface of the control gate active area (412) (as described in reference to FIG. 1B). Similarly, a read transistor gate dielectric layer (420) and an erase gate dielectric layer (422) are formed on top surfaces of the read transistor active area (414) and erase gate active area (416), respectively. A floating gate (424), typically polysilicon, is formed on top surfaces of the control gate dielectric layer (418), read transistor gate dielectric layer (420) and erase gate dielectric layer (422). The floating gate (424) is also formed on a top surface of the field oxide elements (404) between the control gate active area (412) and the read transistor active area (414), and between the read transistor active area (414) and the erase gate active area (416). An overlap area of the floating gate (424) over the control gate active area (412) is typically more than ten times an overlap area of the floating gate (424) over the erase gate active area (416) (as described in reference to FIG. 1B). A width of the floating gate (424) over the read transistor active area (414) is selected to provide desired levels of on-state current and off-state leakage in a read transistor (according to known methods of transistor layout).

FIG. 4C depicts the IC (400) at a subsequent stage of fabrication. A PLDD set of p-type dopants is ion implanted into top regions of the read transistor active area (414) on each side of the floating gate (424) and into a control gate minority carrier supply region (426) in the control gate active area (412) adjacent to the floating gate (424) (as described in reference to FIG. 1C). PLDD implanted regions in the read transistor active area (414) are out of the plane of FIG. 4C, and hence is not shown in FIG. 4C for clarity. A gate sidewall spacer (428) is also formed on lateral surfaces of the floating gate (424) (as described in reference to FIG. 1C). An n-tap set of n-type dopants is ion implanted into the erase gate active area (416) adjacent to the floating gate (424) and into a control gate tap region in the control gate active area (412) proximate to, but not adjacent to, the floating gate (424), to form an erase gate tap diffused region (430) and a control gate tap diffused region (432), respectively. A PSD set of p-type dopants is ion implanted into top regions of the read transistor active area (414) on each side of the floating gate (424) and into the control gate minority carrier supply region (426) in the control gate active area (412) adjacent to the floating gate (424) (as described in reference to FIG. 1C). PSD implanted regions in the read transistor active area (414) are out of the plane of FIG. 4C, and hence is not shown in FIG. 4C for clarity. An anneal process is subsequently performed on the IC (400) to activate and diffuse a portion of the PLDD dopants, n-tap dopants and PSD dopants in the IC (400).

Referring to FIG. 4D, an optional control n-well tap metal silicide layer (434) is formed on top surfaces of the control gate minority carrier supply region (426) and control gate tap diffused region (432), and an optional erase gate n-well tap metal silicide layer (436) is formed on a top surface of the erase gate tap diffused region (430) (as described in reference to FIG. 1F). Additionally, optional metal silicide layers are formed on the top surfaces of source and drain regions of the read transistor active area (414) on each side of the floating gate (424). The source and drain regions of the read transistor active area (414) are out of the plane of FIG. 4D, and hence are not shown in FIG. 4D for clarity. A PMD layer (438) is formed on the top surface of the IC (400), as described in reference to FIG. 1F. A control gate tap contact (440) and an erase gate n-well contact (442) are formed in the PMD layer (438) (as described in reference to FIG. 1D) to make electrical connections to the control gate minority carrier supply region (426) and control gate tap diffused region (432) or the erase gate tap diffused region (430), respectively (through the optional silicide layers (434, 436), if present). Read transistor source and drain contacts are also formed in the PMD layer (438) to make electrical connections to the read transistor source and drain metal silicide layers, but are not in the plane of FIG. 4D and are not shown in FIG. 4D for clarity.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A single poly EEPROM cell, comprising:
    a control gate n-well
    a read gate dielectric layer located within said control gate n-well;
    a control gate dielectric layer also located within said control gate n-well;
    an erase gate n-well coupled to said control gate n-well,
    an erase gate dielectric layer located within said erase gate n-well, said erase gate dielectric being smaller than said control gate dielectric layer; and
    a floating gate that overlaps said control gate dielectric layer, said read gate dielectric layer, and said erase gate dielectric layer.

2. The single poly EEPROM cell of claim 1, further comprising a p-type control gate minority carrier supply region adjacent to said control gate dielectric layer.

3. The single poly EEPROM cell of claim 1, in which said control gate dielectric layer is less than 15 nanometers thick, and said erase gate dielectric layer is less than 15 nanometers thick.

4. The single poly EEPROM cell of claim 1, wherein said floating gate overlap of said control gate dielectric layer is at least ten times larger than said floating gate overlap of said erase gate dielectric layer.

5. The single poly EEPROM cell of claim 4, further comprising a p-type control gate minority carrier supply region adjacent to said erase gate dielectric layer.

6. A single poly EEPROM cell, comprising:
    an erase gate n-well;
    a read gate dielectric located within said erase gate n-well;
    an erase gate dielectric layer also located within said erase gate n-well;
    a control gate n-well coupled to said erase gate n-well;
    a control gate dielectric layer located within said control gate n-well, said control gate dielectric layer being larger than said erase gate dielectric layer; and
    a floating gate that overlaps said erase gate dielectric layer, said read gate dielectric layer, and said control gate dielectric layer.

7. The single poly EEPROM cell of claim 6, further comprising a p-type control gate minority carrier supply region adjacent to said control gate dielectric layer.

8. The single poly EEPROM cell of claim 6, in which said erase gate dielectric layer is less than 15 nanometers thick, and said control gate dielectric layer is less than 15 nanometers thick.

9. The single poly EEPROM cell of claim 6, wherein said floating gate overlap of said control gate dielectric layer is at least ten times larger than said floating gate overlap of said erase gate dielectric layer.

10. The single poly EEPROM cell of claim 9, further comprising a p-type control gate minority carrier supply region adjacent to said erase gate dielectric layer.

11. A method of forming a single poly EEPROM cell, comprising:
    providing a substrate;
    forming a control gate n-well in said substrate;
    forming an erase gate n-well in said substrate;
    forming a read gate dielectric layer over a portion of said control gate n-well;
    forming a control gate dielectric layer over a portion of said control gate n-well;
    forming an erase gate dielectric layer over a portion of said erase gate n-well, said erase gate dielectric layer being smaller than said control gate dielectric layer; and
    forming a floating gate over said control gate dielectric layer, said read gate dielectric layer, and said erase gate dielectric layer.

12. The method of claim 11, further comprising the step of forming a p-type control gate minority carrier supply region adjacent to said control gate dielectric layer.

13. The method of claim 11, in which:
    said control gate dielectric layer is less than 15 nanometers thick; and
    said erase gate dielectric layer is less than 15 nanometers thick.

14. The method of claim 11, wherein said floating gate overlap of said control gate dielectric layer is at least ten times larger than said floating gate overlap of said erase gate dielectric layer.

15. The method of claim 14, further comprising the step of forming a p-type control gate minority carrier supply region adjacent to said erase gate dielectric layer.

16. A method of forming a single poly EEPROM cell, comprising:
    providing a substrate;
    forming a control gate n-well in said substrate;
    forming an erase gate n-well in said substrate;
    forming a control gate dielectric layer over a portion of said control gate n- well;
    forming an read gate dielectric layer over a portion of said erase gate n-well;
    forming an erase gate dielectric layer over a portion of said erase gate n-well, said erase gate dielectric layer being smaller than said control gate dielectric layer; and
    forming a floating gate over said control gate dielectric layer, said read gate dielectric layer, and said erase gate dielectric layer.

17. The method of claim 16, further comprising the step of forming a p-type control gate minority carrier supply region adjacent to said control gate dielectric layer.

18. The method of claim 17, in which:
    said control gate dielectric layer is less than 15 nanometers thick; and
    said erase gate dielectric layer is less than 15 nanometers thick.

19. The method of claim 18, wherein said floating gate overlap of said control gate dielectric layer is at least ten times larger than said floating gate overlap of said erase gate dielectric layer.

20. The method of claim 19, further comprising the step of forming a p-type control gate minority carrier supply region adjacent to said erase gate dielectric layer.

* * * * *